United States Patent [19]

Esslinger et al.

[11] Patent Number: 5,852,449
[45] Date of Patent: Dec. 22, 1998

[54] APPARATUS FOR AND METHOD OF DISPLAYING RUNNING OF MODELED SYSTEM DESIGNS

[75] Inventors: Mark A. Esslinger, Cedar Park; Allan D. Clarke, Austin; Robert M. Howard, Austin; Douglas K. Matchett, Austin; Douglas M. Neuse, Austin; James R. Palmer, Austin; Carolyn W. West, Austin, all of Tex.

[73] Assignee: Scientific and Engineering Software, Austin, Tex.

[21] Appl. No.: 825,979

[22] Filed: Jan. 27, 1992

[51] Int. Cl.[6] .................................................. G06F 15/00
[52] U.S. Cl. ............................................ 345/473; 345/440
[58] Field of Search ..................................... 395/152, 162, 395/163; 345/122, 123, 125; 364/488, 578

[56] References Cited

U.S. PATENT DOCUMENTS

| | | | |
|---|---|---|---|
| 4,730,315 | 3/1988 | Saito et al. .................................. | 371/19 |
| 4,821,220 | 4/1989 | Duisberg ..................................... | 364/578 |
| 4,965,743 | 10/1990 | Malin et al. ................................ | 364/513 |
| 5,168,554 | 12/1992 | Luke ............................................ | 395/161 |
| 5,179,702 | 1/1993 | Spix et al. .................................. | 395/650 |

OTHER PUBLICATIONS

IEEE Press, Computer, "A Survey of Current Graphical Programming Techniques", by Georg Raeder, pp. 11–25, vol. 18, Aug. 1985.

*Primary Examiner*—Robert W. Beausoliel, Jr.
*Assistant Examiner*—Stephen C. Elmore
*Attorney, Agent, or Firm*—George R. Schultz; Strasburger & Price LLP

[57] ABSTRACT

A graphical, interactive debugger for a computer-based discrete-event simulation model of systems having parallel processes includes a run-time graphic user interface module in which predefined events of the executing simulation model are animated, and a run-time interface simulator module for controlling execution of the simulation model based on commands from the graphical user interface. The model and the animation are based on hierarchical directed process execution graphs in which a transaction represents one of several processes executing in parallel within the system modeled with the graphs. One transaction at a time is shown moving between nodes in one of the graphs. The animation follows the transaction as it moves between sub-models represented by each graph, switching to other graphs as needed. Once the transaction is blocked, the next transaction is displayed in context of the appropriate graph and followed until it is blocked. The screen on which animation is presented is divided into two areas. One provides the animation, the other displays the text of trace messages generated by the executing simulation model and on which the animation is based. The animation may be selectively limited to user-specified events, transactions or sub-models, providing detailed probing of the model for purposes of debugging.

7 Claims, 12 Drawing Sheets

FIG. 6B

APPARATUS FOR AND METHOD OF DISPLAYING RUNNING OF MODELED SYSTEM DESIGNS

FIELD OF THE INVENTION

The invention pertains to computer-based "debugging" of parallel computer processes and computer simulation models of parallel process systems, particularly to dynamically animating a computer-based simulation model on a display for purposes of controlling, observing and debugging the executing simulation model or the parallel process system itself.

BACKGROUND OF THE INVENTION

Electronic computer hardware and software and real-time communication and manufacturing systems are becoming overwhelmingly complex. These systems involve increasing numbers of parallel processes or high degrees of "concurrency", and complex scheduling and timing issues that make manual design and optimization a daunting or perhaps impossible task to even the most experienced engineers and scientists. Design and development of such systems require more than the naive intuition that engineers have traditionally relied on. Increasingly intense competition mandates that development time and costs must be continuously improved. Therefore, more efficient design approaches and tools are becoming critical to the success of firms who develop these complex systems.

Computer based simulation models of systems have been available to systems designers for many years. There is a spectrum of computer-based simulation systems. At one extreme are custom coded simulation programs, written in a conventional programming language such as "C" or Pascal or some other language or general purpose simulation languages such as Simula and GPSS. These simulations require a programmer to write and modify a detailed textual computer program. Thus, they are expensive and difficult to modify, and thus are discouraging to use for most systems designers.

Consequently, special purpose modeling and simulation languages have been developed. A user schematically illustrates interconnections of objects and describes each object's behavior in some special purpose language. A preprocessor then translates these behavioral descriptions to a general purpose language such as Pascal or C, adding code to handle interconnections of the objects, and linking to the program a library of functions supporting standard operations. Such systems are intended for designers, and not programmers, to use. Thus, the languages tend to be simple and simulations based on stylized examples. At the other end of the spectrum from custom coded programs are simulation systems having very specific models. A user puts together objects, sometimes in graphical form, which have been modelled. The simulator then computes the performance of the system. Examples of this type of system include Spice, which has fixed models for various components like transistors and, for digital systems, gates and standard cell components. Although a user requires no familiarity with the programming language, the possibility of specifying new models is very limited.

In the past, computer based simulation models have not been very effectively utilized. Ideally, the simulation model should be an integral part of and used by the system designers (not modeling programmers) during all phases of the design and development cycle of a system. Use of the model at the beginning permits overall system evaluation and evaluation of alternate system architectures. As subsystem designers become involved, models of these subsystems should be maintained and made consistent with the overall system model. Maintaining the consistency of the system and subsystem models with the real system permits evaluation of the impact of design choices at the subsystem level on the entire system. Unfortunately, most simulators are used at the beginning to evaluate the feasibility of a particular system architecture and subsequently abandoned. Or they are used after there has been substantial development and integration of the real system to understand system level issues that arise.

Furthermore, many simulation systems are not suitable for modeling systems with multiple concurrent processes executing simultaneously.

A computer based simulation modeling system called SES/Workbench® has been developed by Scientific and Engineering Software, Inc. of Austin, Tex. that has the ability to simulate, with a computer model, systems having multiple concurrent processes and provides a structure to facilitate its use by engineers throughout the design cycle of these systems.

The system is based on a model that is broken down into several sub-models. The sub-models are fitted together in a layered hierarchical fashion in which sub-models may call other sub-models, which in turn may call other sub-models. This promotes a structured, top-down design approach (or, if desired, a bottom-up approach) in which the model follows the design of the real system. The topology of each sub-model is represented by an extended directed graph, which will hereafter be referred to as a "process execution graph". A directed graph is a collection of "nodes" and "arcs". Each arc connects two nodes and is directed from one node to the other. The nodes are analogous to components of a system (such as resources and functions), and the arcs represent relationships among those components. Each graph thus represents high-level behavior and structure of a sub-system. Forms associated with each node and arc define or specify the characteristics of the particular node or arc. An individual node may be defined to represent and specify another sub-model, which is in turn is represented by another extended directed graph. This property permits construction of a hierarchy of extended directed graphs.

Though the sub-models can be constructed textually, a design interface or design capture module permits a systems designer to pictorially construct the model by selecting and connecting with arcs predefined node types. This graphical topological definition of each sub-model is then translated or mapped into a source code simulation language, compiled and then linked to a run time library of commands to form an executable simulation model.

The simulator's ability to model parallel systems comes from the use of "transactions". Whereas the collection of nodes and arcs represents the structure of the system, transactions represent the behavior of the system. In a more generic sense, a transaction is a model of a process or a unit of work. The flow of the transaction through the structure of the graph defines a process. In a parallel system, possibly having at any one time multiple processes occurring, the transactions provide an ideal model. When the simulation model is compiled and executed, transactions are created and flow through portions of the model, carrying with the transactions the state of the processes from node to node along a path of arcs and causing functions to be executed or resources to be used at the nodes. Multiple transactions may occur within a sub-model at any one time, and multiple transactions may reside in a single node at any one time.

Also associated with the simulation model are resources, some physical or logical component for which the processes represented by the transactions compete. These too are defined by forms associated with the resource.

In more real terms, depending on the type of system being simulated, a transaction may represent a program, a control or data signal or a data packet. A node represents manipulation of a physical resource (for example, its release or allocation), or some other processing step in a transaction's life. In a computer system model, it could represent scheduling of a microprocessor, a system bus, or a disk drive. In a model of software, it might represent a software module, a subprogram or a process control action. It could represent, in a digital electronics model, manipulation of a chip, buffer, bus, clock, register or gate.

Furthermore, the simulation model when executing may also be thought of as a parallel program with multiple "execution threads". Each transaction in the model represents a separate execution thread, carrying with it an execution environment similar to that of execution threads in modern, rich programming languages.

One of the problems in using such computer based simulation models lies in "debugging" the designs being simulated when they do not behave as expected. One of the primary purposes of simulating system designs is to discover problems with them at an early stage. However, simulators have not offered effective debugging features. Usually, debugging must be done using the results of (e.g. statistics from) the simulation. Results can be reported in one of two basic ways—first with data and second graphically by animating the simulation. A simulation model such as the one described will produce an enormous amount of data. To wade through this information, therefore, simulation models selectively collect during the simulation predefined statistics in a file that could be reviewed by the designer.

A statistics approach is not as effective at revealing the dynamic behavior of the simulation that will enable a designer to debug the system as is animation. However, only simple simulations have so far been effectively animated. With previous methods, there has been no effective way of animating complex parallel systems. In simulations of such complex parallel systems, there are simply too many concurrent events and transactions for a designer to effectively use animation to debug a system. Moreover, there has been no effective way of animating complex parallel systems.

SUMMARY OF THE INVENTION

The invention is an animator and graphical "debugger" for interactively examining behavior and providing corrective designs for a computer process that simulates a model of a complex system having high levels of concurrent processes or of executing parallel computer processes.

To animate parallel processes, the invention displays extended directed graphs representing a model of the system of parallel processes. Arcs represent flows of control and data representing the execution of a process. Nodes represent processing steps in a process. A special, sub-model node represents placement of a hierarchical subgraph within another graph. Transactions represent processes. Animation is performed for only one transaction at time by moving a transaction symbol along arcs between the nodes. Multiple transactions are not displayed simultaneously. A transaction is animated until it "blocks." Before it blocks, a transaction may flow though several directed graphs, the display switching between graphs as necessary to follow the transaction. When a transaction blocks, the graphic context switches to that of the next executing transaction.

The animation is generated from "trace" messages from an executing simulation model or, more generally, executing computer processes. In a simulating model, each executing transaction produces trace messages upon the occurrence of predefined events. There are a number of such predefined event types each of which is animated in a distinctive way. For example, an interrupt event is animated by graphically displaying a lightning bolt, whereas a delay event is animated by turning the hands of a clock. Using distinctive animations for each event type significantly enhances the user's ability to understand what is happening in the model. The trace messages identify the nodes, arcs, graphs and event types, and determine which particular transactions are to be animated. A user may specify the animation context by selecting certain transactions or certain sub-models or graphs to be animated. This fine-grained control over animation greatly enhances debugging, as any portion of the simulation may be isolated for review.

In accordance with various other aspects of the invention, animation is displayed in a window on a video display screen coupled to a data processing system in which the simulation or other parallel processes are occurring. Another window logs flows of trace messages to allow a user to review a previously executed transaction. This log window helps a user determine the past events that lead to the model's current state.

To interact with a running model and control its animation, commands are issued by the user to stop and step the model and to change its state.

In the preferred embodiment of the invention, the graphical runtime interface is a separately executing process coupled to the executing computer process to be debugged by two "pipes": one for receiving trace information and command prompts; the other for sending commands. In the executing simulation model, there is an event monitor that generates the tracing information, and a command interpreter which receives commands from the graphical runtime interface and executes them.

BRIEF DESCRIPTION OF THE DRAWINGS

FIG. 6B is an illustration of the soft button, break and trace tables used by the graphical runtime interface to simplify the user input process.

DETAILED DESCRIPTION OF THE DRAWINGS

A multi-tasking simulation model program such as that of SES/workbench of Scientific and Engineering Software, Inc. of Austin, Tex. is composed of one or more submodels. Each submodel is represented by an extended directed graph. The basic components of an extended graph are nodes, arcs, transactions and resources.

Each node in the graph represents the manipulation (for example, the allocation or release) of a physical or logical resource, or some other processing step in a transaction's life. In a computer system model, a node might represent the scheduling of a microprocessor, a system bus, or a disk drive. In a software model, a node might represent a software module, a subprogram, or a process control action such as the forking of a process into subprocesses. In a digital electronics model, a node might represent the manipulation of a chip, buffer, bus, clock, register, or gate. Each arc connects two nodes and is directed from one node to the other. It represents a path along which transactions may flow from one node to another.

Transactions are basic entities representing execution processes in a model. A transaction flows from node to node manipulating resources and executing statements. At each node the transaction gets processed, departs the node along an arc, flows across the arc to the next node, and either begins its processing or enters a queue for that node (if other transactions are already executing).

Each resource represents some physical or logical component for which transactions (that is, processes) compete. Some typical examples are processors, busses, software schedulers, RAM, or database locks.

Figure 1:
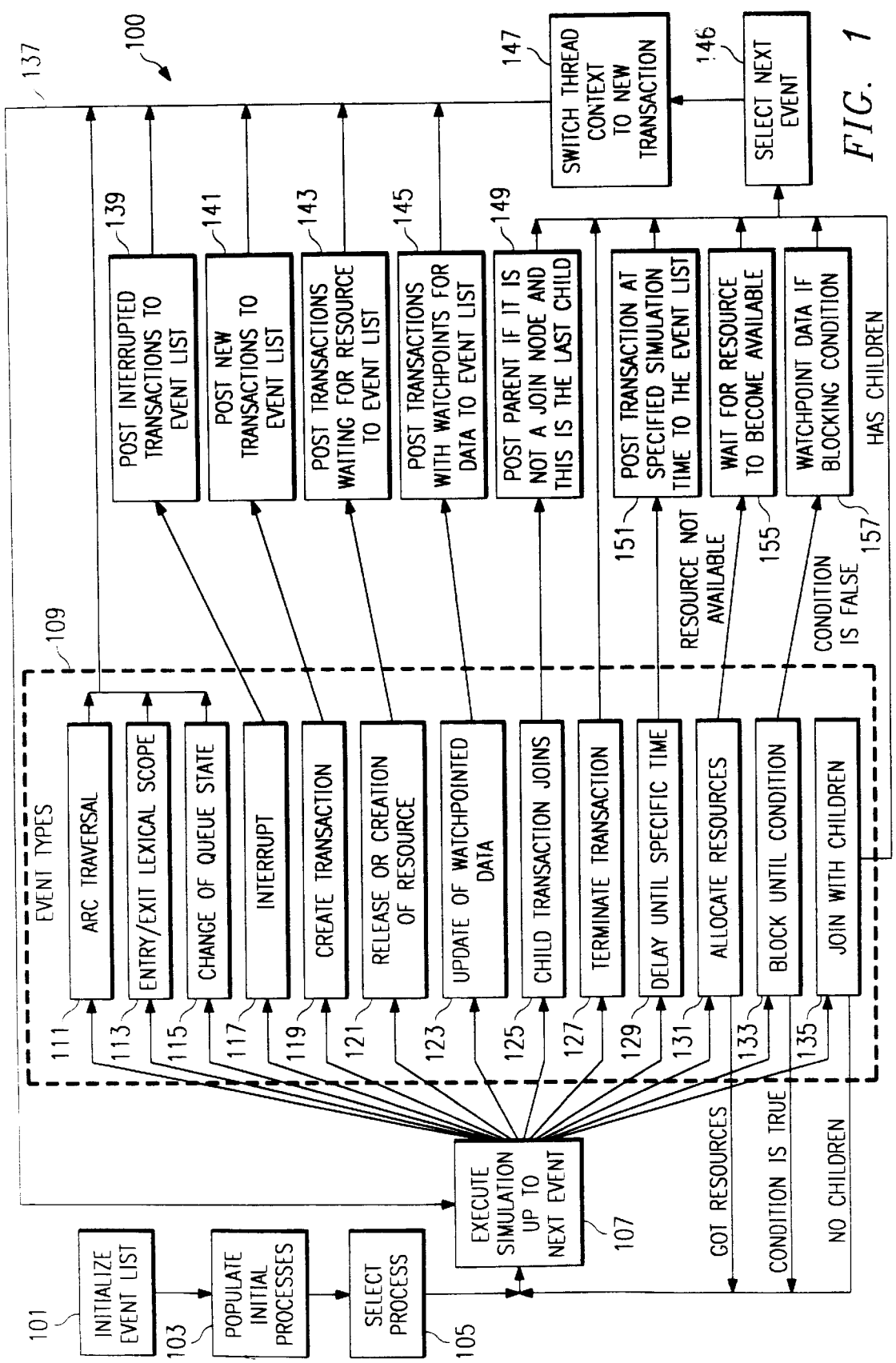
FIG. 1 is a flow diagram of a computer-based, discrete-event simulation process.

Referring to FIG. 1, a simulation model is shown, specifically a discrete event simulator 100 which uses the model previously described. A discrete event simulator is a computer program that simulates a model as a sequence of discrete events such that the model changes state at discrete points in simulation time, rather than continuously changing. It represents each transaction in a multi-tasking simulation model program by a distinct thread of execution. The simulator executes one transaction at a time and continues executing the transaction until it executes a simulation function which must block. The simulator then switches execution context to the transaction at the head of the event list and executes it until it blocks.

The order of execution of transactions is governed by an event list. The event list is composed of a sequence of transactions which are ordered by simulation time. Each transaction in the event list awaits its turn to execute in sequence one or more simulation event functions.

The execution of some simulation functions may result in the addition of one or more transactions to the event list in a process called "posting a transaction on the event list."

At step 101, the event list is first initialized and then populated with transactions at step 103. The first process is selected at step 105 to begin executing the simulation and enters a main simulation loop. The transaction executes the simulation model specifications at step 107 until it executes one of the simulation functions within box 109 which are distinguished as events. These events include: transaction transversing an arc at event 111, entry or exit of a lexical model scope 113, a changing of queue state 115, interrupt of another transaction 117, creating a transaction event 119, a release or creation of resource event 121, updating watch pointed data 123, joining child transactions event 125, terminating the transaction 127, delaying a transaction until a specific model time event 129, allocating a resource 131, blocking the transaction due to an unsatisfied condition 133, and joining the transaction with children event 135.

Occurrence of any of these events may produce a trace message, if tracing is enabled, that will be used in animating the executing transaction. Occurrence of certain of these events, namely events 111, 113 and 115, do nothing more than cause a trace message to be produced. The selected transaction or process returns to executing the simulation, as indicated by return loop 137. Occurrence of other events may result in the posting of transactions to the event list. If any transaction is to be interrupted at event 117, the interrupted transaction is posted to the event list at step 139. If a transaction is created at event 119, it is posted to the event list at step 141. Similarly, if a transaction releases or creates a resource, transactions waiting for the resource to become available are posted on the event list at step 143. If a transaction includes a watchpoint for data, it is posted to the event list at step 145.

Other events may trigger a "blocking" of the transaction. Blocking results in removing a next transaction from the event list, shown at step 146, and switching the simulator context to an execution thread associated with the next transaction, shown by step 147. Switching to another simulation context for the new transaction generates a trace message.

If a child transaction joins at event 125, and if the parent transaction is joining at a join node and this is the last child, the parent transaction is posted to the event list at step 149 and the next transaction is removed from the event list at step 146. If the transaction is to be delayed until a specified simulation time at event 129 it is posted to the event list at step 151 for the specified simulation time. At event 131 in which resources are to be allocated, if the resource is available, the simulation returns to the step 107, and the simulator executes up to the next event. Otherwise, the transaction must wait until the resource becomes available, indicated at step 155, and a new transaction begins executing as previously described. Similarly, when a block condition is encountered at event 133, the transaction continues to execute if the block condition is "true". If false, meaning there is a blocking condition, data for satisfying a true condition is "watchpointed" at step 157, meaning that the simulator will respond when the data is changed by posting transactions which have blocked, at step 157, and which have conditions depending on the data value. Then a new transaction begins executing as previously described at step 146. Like events 131 and 133, the event 135 (in which the parent transaction is to be joined with its children) blocks, and a new transaction begins at step 146 if it has children to join; otherwise it returns to step 107 to continue executing.

Termination of a transaction, event 127, results directly in the next transaction being removed from the event list at step 146, followed by a context switch to the execution thread of the new transaction at step 147, and the simulation being executed by the next transaction up to the next event.

Figure 2:
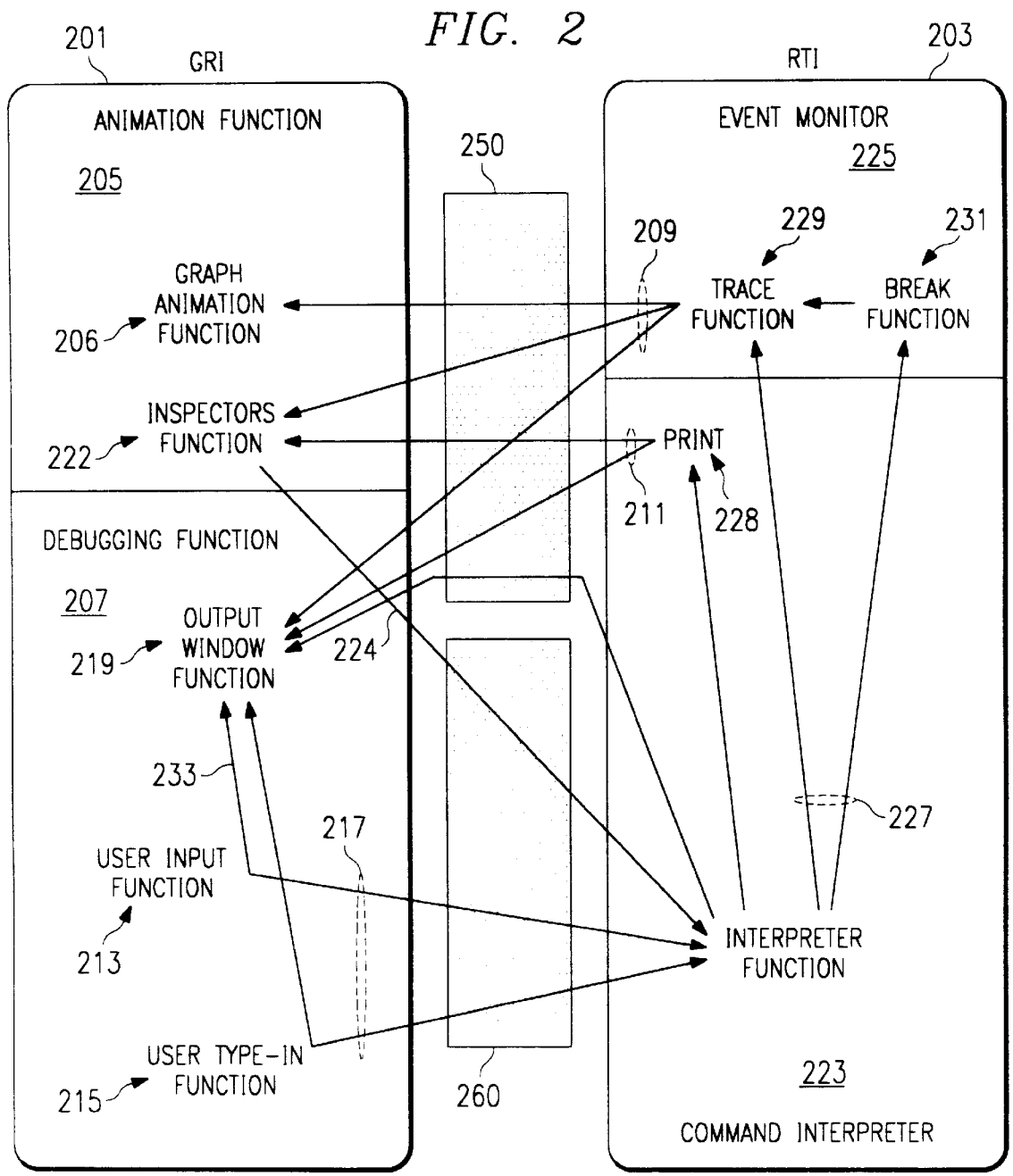
FIG. 2 is a schematic representation of components of an interactive animation and debugging process for a discrete-event simulator such as the one shown in FIG. 1 and other parallel processes.

Referring now to FIG. 2, to provide animation of the simulator or simulation model shown in FIG. 1, a parallel process is employed. One process is the graphical run-time interface (GRI) 201, which provides a user interface to the running simulator, and a back-end runtime interface (RTI) 203 that provides interactive access to and control over the running simulation model. The RTI is preferably part of a runtime software library that is part of a simulation language used by the simulator. This library is linked to a compiled simulation model which is written in the simulation language to produce the simulator.

The GRI and the RTI communicate via communications channels or "pipes" 250, 260 that are established when the model execution is launched. The GRI contains an animation function shown as block 205, and a debugging function at block 207. The animation function includes a graph animation function 206 which causes the dynamic update of the graphical view of the running model based upon trace messages 209 and print output 211 received from the RTI. The graph animation function 206 issues print commands to the RTI as needed to periodically update some of the animation displays.

The debugging function 207 accepts user input commands from user input function 213 or user type-in function 215, issues commands to the RTI at 217 and displays in an output window function 219 responses 221 from the RTI, as well as trace messages 209, print messages 217 and user input 233. The user input function 213 involves clicking on menus and tables and listing commands using a "mouse", a computer input device. User input may cause commands to be issued to the RTI 203 to change event monitor settings, to start or continue model execution, or to print model information.

The inspector function 222 in the GRI uses a combination of event trace messages 209 and print command output 211 from the RTI to drive the dynamic update of the content of inspector windows as the model executes. The inspector windows display information specifically requested by the user via the user input function 213. The inspector function 222 issues print commands 224 to the RTI as needed to periodically update the content of the windows at 219 and to guarantee that the content is up to date when a break in model execution occurs at 231.

RTI 203 contains a command interpretation function 223 and an event monitor function 225. The interpreter function 223 accepts commands received from the GRI and causes those commands to be executed. Acceptance of a command causes a response 221 (generally including a prompt for a new command) or error message to be sent to the GRI and/or the passing of model execution control and event monitoring settings to the event monitor function 225. Print commands are forwarded to print function 228 for execution.

The print function 228 causes print command output 211 to be sent to the GRI in response to print commands received. The print command output 211 describes the state of parts of the model, that is the values associated with model objects, for those objects selected by the user.

The event monitor function 225 monitors the state of the executing model to determine when traceable events occurs and when breaks in model execution occur. When a traceable event is detected, the event monitor 225 causes a trace message to be output. When a break in model execution occurs, the event monitor 225 causes execution control to be passed to the command interpretation function 223.

A trace function 229 monitors the state of the executing model to determine when traceable events occur. The model state is compared against the trace settings to determine whether or not to output an event trace message 209. The trace function 229 also outputs a trace message 209 upon receiving a request from the break function 231.

The break function 231 monitors the state of the model and compares that state to break and step control settings to determine when to break model execution. When a break in model execution occurs, the event monitor 203 causes execution control to be passed to the command interpretation function 223 and causes the trace function 229 to output an event trace message 209 for the event which caused the break.

The command interpreter 223 is called when the model first begins executing. It sends a model startup message to the GRI and then enters a command prompt-read-execute loop. The simulation model is paused while the command interpreter is executing commands. When the GRI issues a step-or-continue command the execution of the model simulation continues. For other commands the interpreter 223 outputs a response to the command to the GRI 201 and then returns to the beginning of the command loop. Break and trace commands update break, step, and flow settings.

The model execution is paused and the command interpreter regains control when the simulation model executes an event which completes a step, or a breakpoint, or executes a flow control breakpoint to let the GRI synchronize with the model, or the simulation model executes a reset.

During the execution of each simulation event the event monitor 225 checks to see if the event being simulated satisfies the constraints of the step settings or break settings. If the constraints are satisfied a trace message is sent to the GRI, and a command interpreter loop is entered. If the constraints are not satisfied the trace settings are checked to determine whether a trace message should be output to the GRI. If the trace message was output then flow settings are checked to determine whether model execution should be paused to synchronize with the GRI.

Figure 3:
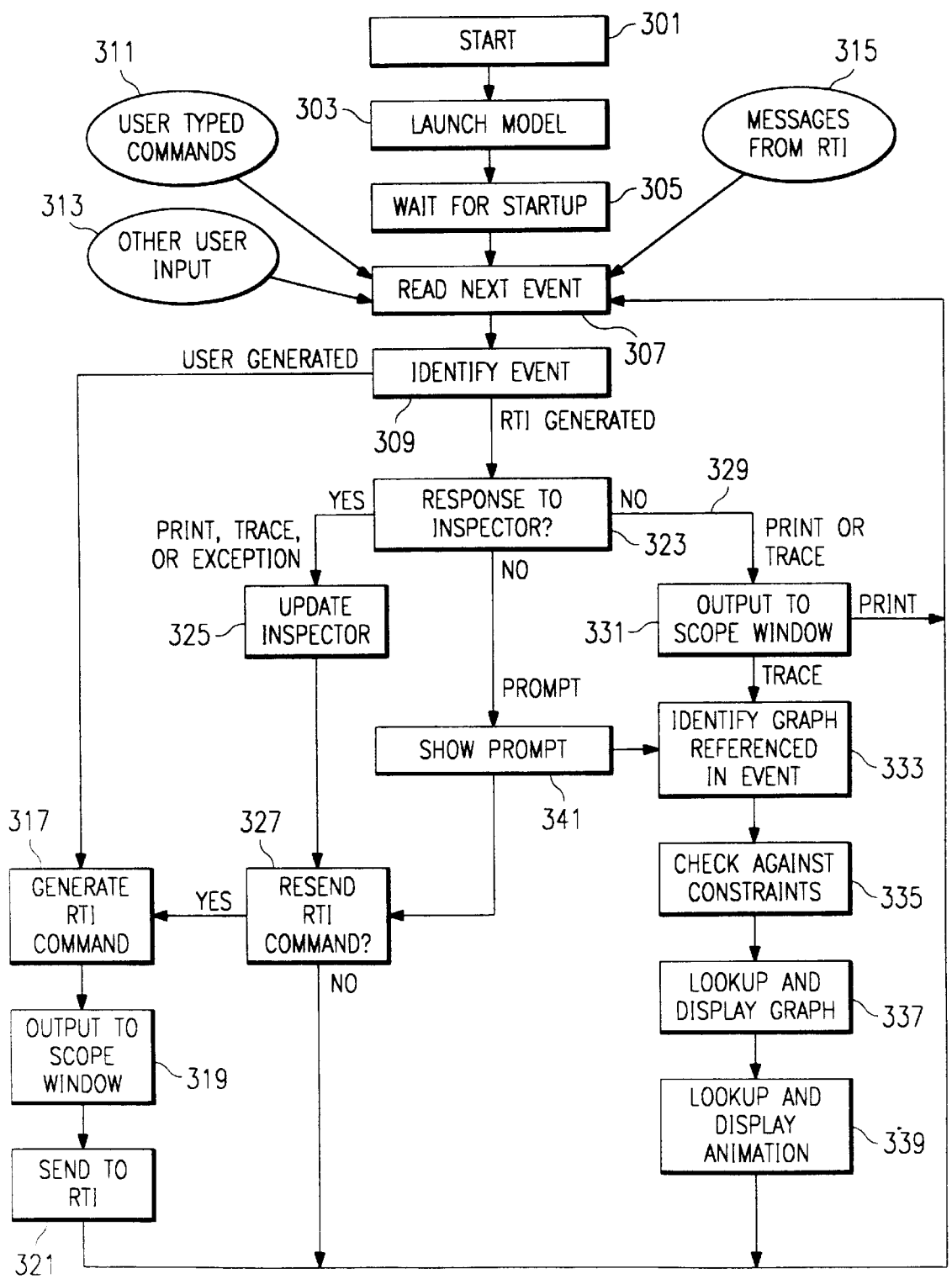
FIG. 3 is a flow diagram of processes in a graphical runtime interface for an interactive animation and debugging program for the simulator of the type shown in FIG. 1.

Referring now to FIG. 3, simulation is initiated by starting the GRI process, as indicated by step 301. Starting the GRI process launches, at step 303, execution of the simulation model and waits for its startup, step 305. Once the simulation is running, it reads a next event, at step 307, and identifies it at step 309.

The GRI is event driven. Sources of events are: user typed commands 311; other user input generated by clicking on a button, filling in a table, or creating an inspector 313; and RTI messages 315 such as e.g., trace, print, prompt.

Events that arise from user input usually generate RTI commands, step 317. The type of command generated depends on the window which handles the event. Inspectors generate trace and print commands when they are first created; they subsequently generate print commands to keep their content updated. RTI commands are first echoed in the output area of the SES/scope window, step 319, and are then sent to the RTI, step 321.

Messages received from the RTI 315 provide information needed to update inspectors and to animate the model. Inspectors update their content from print, trace, and exception messages. There are numerous kinds of print and trace messages. Node entry and node exit trace messages, for example, contain population data, which would be used to update a node inspector. Inspectors that are updated from print messages need to resend RTI print commands during model execution. Whenever the RTI receives one of these print commands, it sends back a print message 329 containing the needed data which is utilized at step 325. Sending of these commands is triggered by receipt of various kinds of RTI messages. Inspectors usually resend RTI commands whenever they receive a prompt message, if model time has elapsed. Some inspectors resend commands on receipt of RTI print or trace messages. Note the flow of print, trace, exception, and prompt messages into the resend RTI command box in FIG. 3.

At step 323, it is determined whether the RTI generated event is in response to an inspector. If the RTI event is in response to an inspector, the print, trace or exception information updates the inspector at step 325. At step 327 an option to resend the RTI command is provided. If chosen, an RTI command is generated and output to window and to RTI, as shown at steps 317, 319 and 321. Otherwise, the GRI returns to step 307 to read the next event.

Print, trace, and exception messages all contain a flag which indicates whether or not the message was generated in response to an inspector request. This flag is used to avoid displaying data redundantly, i.e., if information is displayed in an inspector, it should not also be shown in the SES/scope output area.

The print or trace message at branch 329 will cause data to be displayed in the SES/scope output area at step 331. If the RTI message was a print message, the process returns to step 307 to read the next event. RTI trace messages resulting from inspector generated commands alone do not produce animation, as indicated by branch 329. Trace messages may or may not produce animation, depending on several factors, such as whether or not animation is disabled and whether or not the animation scope is constrained, as shown at 335. At step 333, the graph referenced by the event described in the trace message is identified. If the trace is animatable the relevant graph is located, step 337, and the animation is identified and displayed, step 339.

On receipt of a prompt message, the prompt string is displayed, step 341, and inspector generated print commands are sent to the RTI if necessary, as shown by steps 327 and 317. Print and trace messages not directed to inspectors are displayed in the SES/scope window output area.

Figure 4:
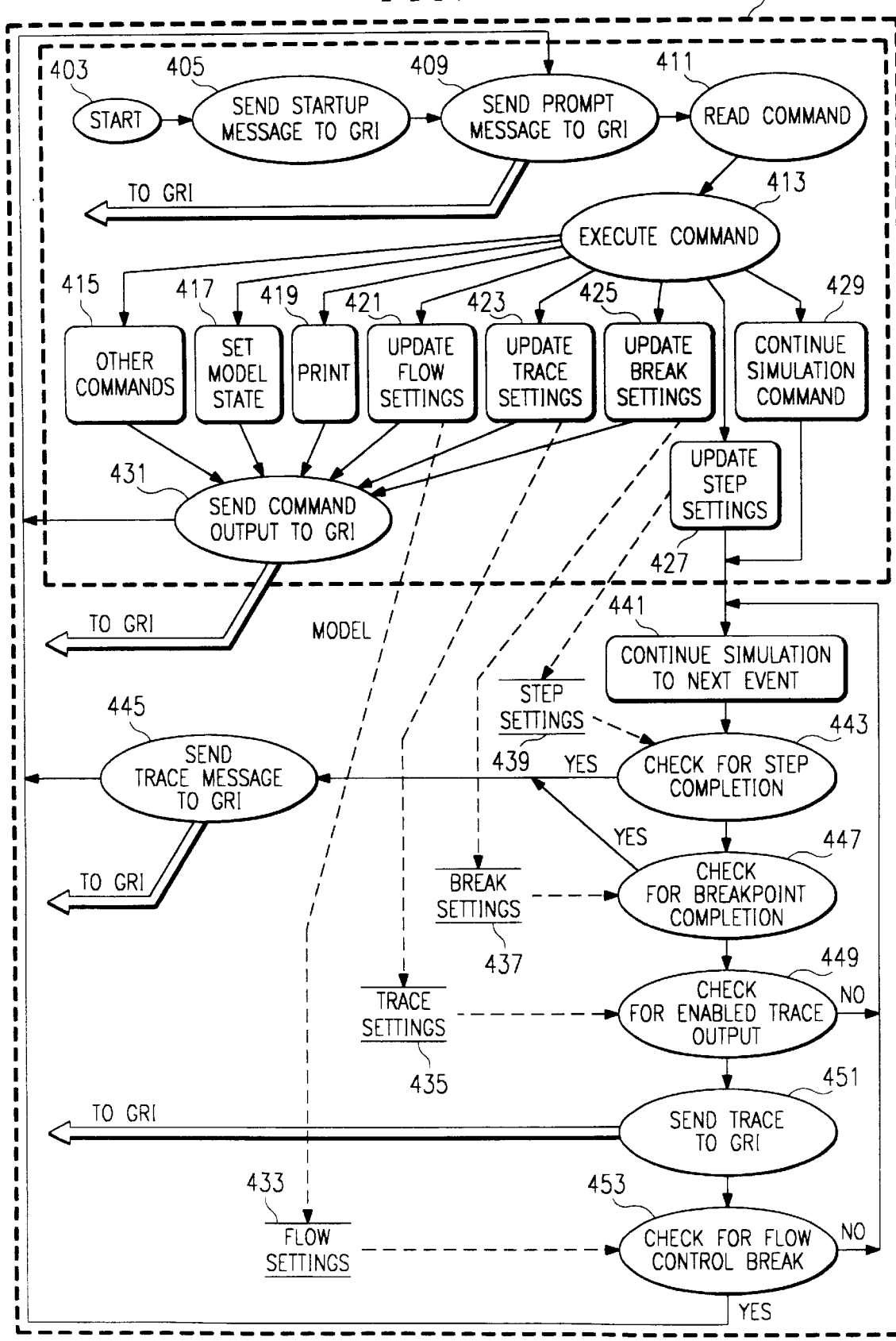
FIG. 4 is a flow diagram of a back-end interactive interface for, and its interaction with, a simulator of the type shown in FIG. 1, as well as with the graphical runtime interface of FIG. 3.

Referring now to FIG. 4, a flow diagram of the back-end interactive interface and the graphical run time interface is shown. Once the model 401 is launched at step 403, it sends a startup message to the GRI, step 405. The RTI then sends a prompt message to the GRI at step 409, and reads any commands from the GRI at step 411. Once a command is received, it is executed at step 413. The various types of commands and their execution are represented by blocks 415 to 429. Blocks 415 to 425 involve set model state commands, print commands, update flow setting commands, update trace setting commands, update break setting commands, and all other commands that are not specifically identified in the Figure. These commands cause a command output to be sent back to the GRI, as indicated by step 431. Execution of an update flow setting command, block 421, causes flow settings 433 in the execution model to be updated. Similarly, commands affecting trace settings, block 423, break settings, block 425, and step settings, block 427, result in updating trace settings 435, break settings 437, and step settings 439, respectively, in the executing simulation model 401.

If an update step setting command 427 or continue simulation command is received, the RTI enables the model, as indicated by step 441, to continue simulation, in the manner shown in FIG. 1, until the next event. If the model completes a step before the next event, as shown by step 443, a trace message is sent to the GRI, as indicated by step 445. Similarly, if a preset break in the model's execution is reached before the next event, at step 447, a trace message is also sent.

At step 449, if the simulation is enabled for trace output, an event causes a trace to be sent to the GRI at step 451. Otherwise, the simulation proceeds to the next event, as indicated by block 441. If a trace is sent to the GRI at the occurrence of an event, flow control is checked at step 453 for a flow break. A flow break occurs automatically to permit the GRI to resynchronize with the execution model, or in response to a stop simulation command from the user. If there is a break, the model execution stops and the RTI sends a prompt message to the GRI at step 409 to receive instructions. If there is no flow break, the simulation continues at step 441.

Figure 5:
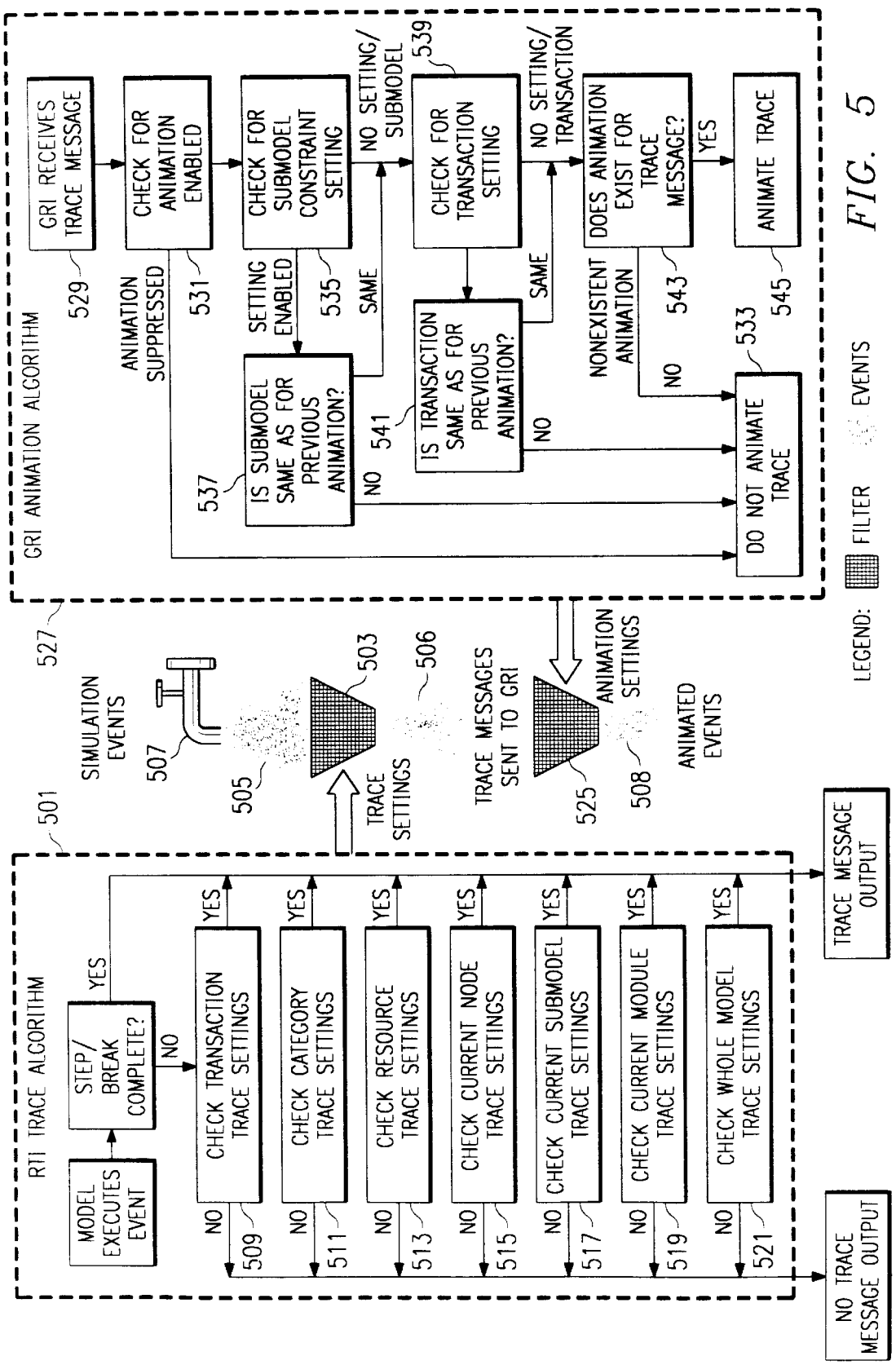
FIG. 5 is a flow diagram for processes in the graphical runtime interface of FIG. 3 and the back-end runtime interface of FIG. 4 relating to producing and using trace messages as a basis for animation of a simulation carried out by a simulator or parallel process of the type shown in FIG. 1.

Referring now to FIG. 5, a flow diagram is shown for processes in the GRI and RTI relating to trace messages being produced and used for animation of the simulator model. As the model execution proceeds, potentially large numbers of events can be generated, most with a resulting animation. The communication of these events to the GRI plus the resulting animations can slow down the effective rate of elapsed simulation time. To allow the user to raise the throughput of the simulation, communications and animations are adjusted using trace settings in the RTI and animation settings in the GRI.

The model checks a series of settings outlined by box 501 to determine whether the current event should result in trace messages being generated to the GRI. These checks behave like a first filter on simulation events, as pictorially illustrated by filter 503 which strains events 505 flowing from faucet 507 representing the simulation module. There are four trace constraints: transaction 509, category 511, resource 513, and context. The contextual constraints include restrictions based upon the current scope of the event, namely the current node 515, the current submodel 517, the current module 519, and the entire model 521.

Tracing can be enabled or suppressed entirely based upon the combinations of these four constraints. Combining these constraints results in flexible control over trace generation. For example, users can suppress trace for an entire module, yet can still enable trace for one node in that module.

It should be noted that under one circumstance, trace is generated which bypasses the constraints described above. When a "step" or "break" is completed or taken, trace is issued unconditionally; this allows the execution context to be sent to the GRI, keeping the SES/rti and GRI synchronized to the same context. This is shown in FIG. 4, steps 443 and 447.

The trace messages, when received by the GRI, are then taken through an animation constraint process 527 that allows constraining of animation using a general on/off facility, using a current context constraint, and using a current transaction constraint. This constraining process is analogous to a second filtering of simulation events, as illustrated by the second filter 525. Trace messages 506 flow through the constraining second filter 525 providing animated events 508.

The animation process begins at step 529 with the GRI receiving trace messages. If the user has suppressed animation, no animation occurs as indicated by blocks 531 and 533. If the user has constrained trace to the current context (submodel), at steps 535, trace for other submodels is not animated as shown by flow through steps 537 and 533. If the user has constrained trace to the current transaction, step 539, trace for other transactions is not animated as shown by flow through steps 541 and 533. As a final hurdle, an animation must be defined for the given kind of trace, otherwise no animation is performed for the given trace event, steps 543, 545 and 533.

One exception to this GRI constraint process is when a trace message is a response to an inspector. As shown in FIG. 3 by steps 323 and 325, these trace messages are not filtered, but are passed to the inspector. This allows users to suppress "normal" trace in a desired scope, yet still be able to inspect objects within that scope without resulting in any unwanted animations.

Figure 6A:
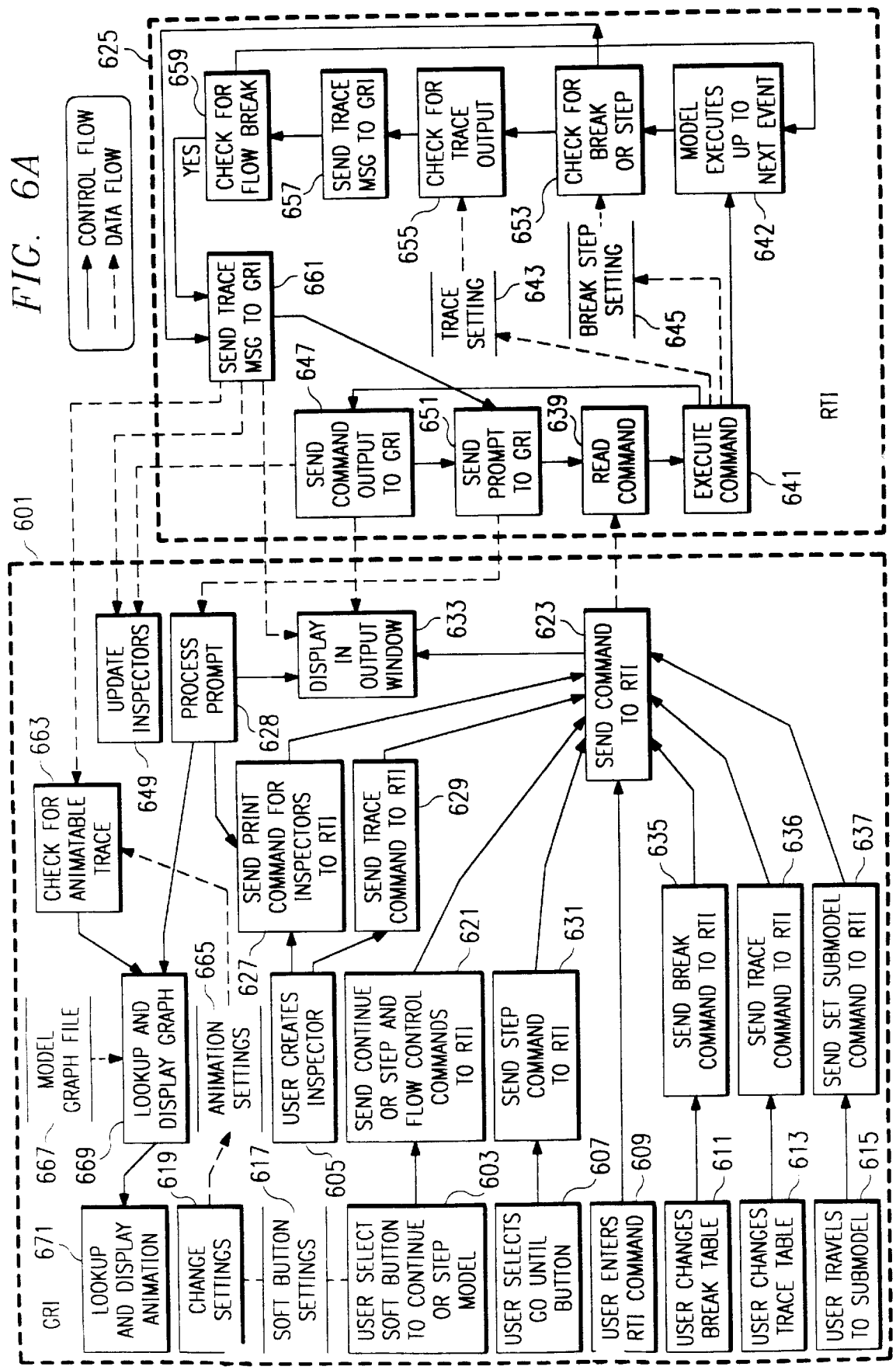
FIG. 6A is a data and control flow diagram between functions and components of processes of the graphical runtime interface process of FIGS. 3 and 5, and the back-end runtime interface of FIGS. 4 and 5.
Figure 6B:
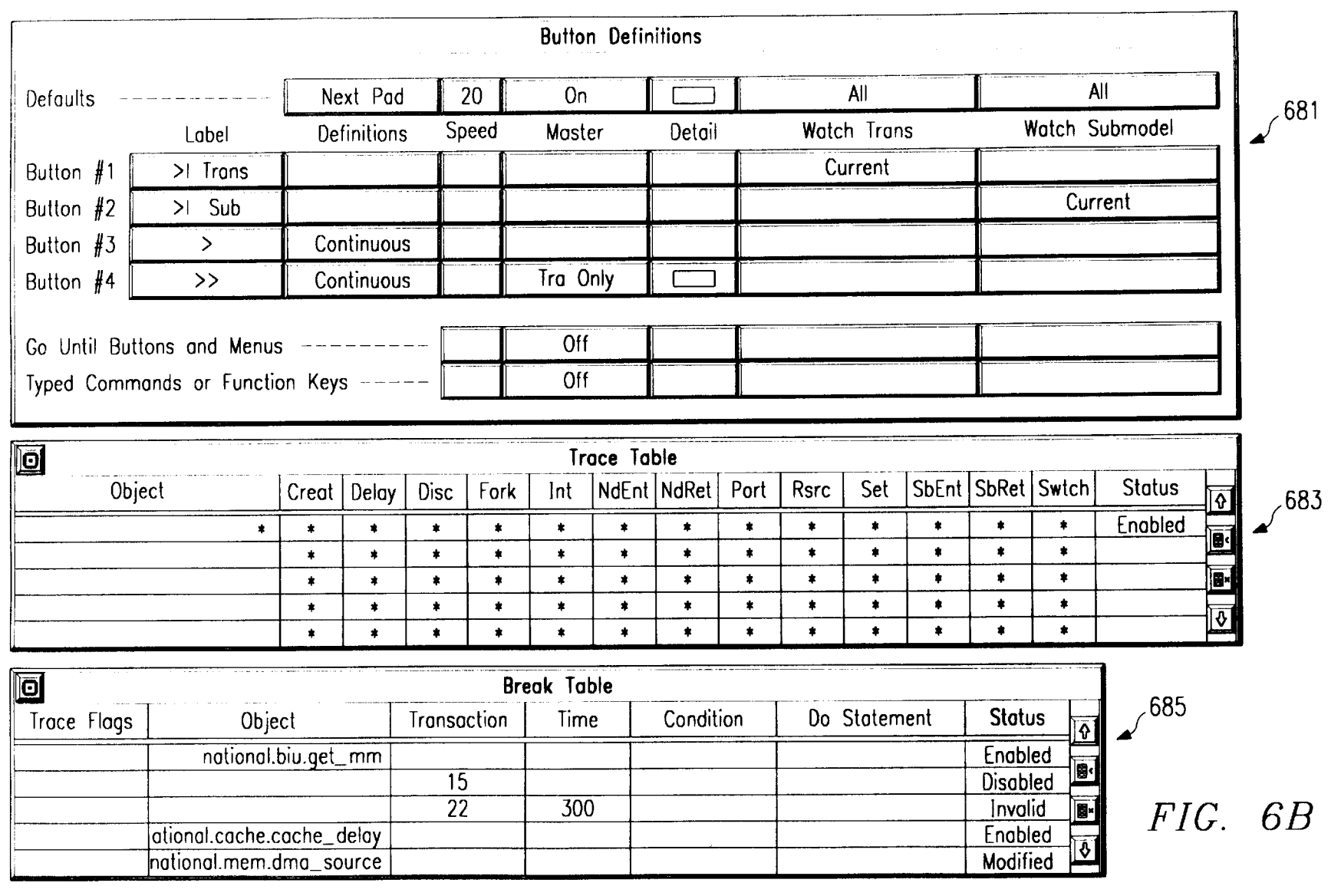

Referring to FIG. 6A, this is a data flow and control diagram for the GRI and the RTI, and shows many user-friendly features that may be incorporated, but are not necessary for, the GRI. Some of the following description of data flow and control connections involves previously described processes. However, the description of processes is not referenced back to the earlier figures. FIG. 6B will be referenced as specific tables are mentioned which are used by the GRI to simplify the user input process.

The GRI 601 includes mechanisms available to a user for changing the state of the model, simulation, and animation. These can be considered in seven basic groups: soft buttons, indicated by block 603; inspectors, block 605; the "go until" buttons, block 607; manually entered rti commands, block 609; and the break table, block 611, the trace table, block 613, and travelling, block 615.

The soft buttons provide a means for the user to customize frequently used stepping commands by setting the soft button settings 617 using a change setting routine, indicated by block 619. These buttons accommodate four distinct configurations to control the advancing of the simulation. Each button contains a complete stepping context, including factors like animation speed, animation detail, refresh controls, and transaction and locale constraints. When changing a setting of a soft button, form 681 shown in FIG. 6B is invoked and the user can alter this stepping context information via the user interface.

When pressed, each button sends its stepping context to a manager 621, which converts this to a command that is sent at block 623 to the RTI 625. The command includes flow control information that governs how far (measured in number of events) the model may get ahead of the GRI.

Inspectors allow probing the state of selected objects, independent of the current focus of execution within the model, and provide a convenient mechanism for watching several objects simultaneously. At step 605, the user chooses the inspector kind when an inspection window is created, which may resemble windows 711, 713 or 715 shown in FIG. 7. The inspector issues a print command to the RTI, as indicated by blocks 627 and 623, to get the current state for a target object. It also issues a trace command, shown by blocks 629 and 623, to enable collection of the desired data, and receives a unique identifier (a key) from the RTI. This key allows the inspector to monitor incoming trace and to recognize information pertaining to this particular inspector. When such trace information is recognized, the inspector recalculates its state, redisplaying only when the context has changed.

The "Go until" buttons, block 607, allow the user to advance the simulation to a particular point in time, to a particular trace number, or until a particular transaction becomes active. When the user presses the button and enters the required information in the ensuing text box, an appropriate step command is constructed at step 631 and sent to the RTI at step 623. The simulation runs continuously until the specified condition is reached, or a breakpoint is completed at step 653.

As indicated by block 609, users can enter text commands for the RTI 625 in the model's simulation language within a window 709. The characters composing the command are displayed in a user input subwindow, as indicated by block 633. Then the command is sent to the RTI, as indicated by block 623. Eventually a prompt returns from the RTI, indicated by block 628, with a new model context (location); the GRI recognizes and travels to this location.

A break table 685 shown in FIG. 6B is an aid for constructing breakpoint commands, thus insulating the user from particular syntax concerns. Items within a row of a break table identify the object, trace conditions, time and so forth that pertain to a breakpoint. The last item in each row indicates the status for the breakpoint and controls when commands are actually issued, as shown by step 635, to the RTI. If the user modifies the "object" field, a condition identified by block 611, the break table issues a "print" command to the RTI to verify that the "object" is valid (not diagrammed). In addition, the name for the object is "expanded" to include the object's parent module and sub-model. The breakpoint command is assembled in the correct syntax and sent to the RTI, as indicated by blocks 635 and 623. Though not shown by the drawing, the break table uses the current command number (line number) to identify a subsequent initial response from the RTI. When the RTI acknowledges a successful command, it also supplies a unique identifier (key) which the break table records as part of its information for that row. This key may be used for a subsequent disabling of the break point.

The trace table 683 shown in FIG. 6B is very similar to the break table in the mechanics of filling-in items, assembling commands, and handling keys. When the user changes a trace table at block 613, a trace command is sent to the RTI as indicated by blocks 636 and 623.

To display certain submodels or graphs which may be represented in the displayed graphs by a node icon, the user can apply the travel tool to send a set sub-model command, step 637, for travelling to the sub-model by clicking on the node icon or equivalently choose a submodel name from a list. The GRI then locates the graph corresponding to the submodel icon, searching outside the current module if needed. Once the graph has been found, a "set" command is issued to the RTI. The new context in the returning prompt is used to graphically display the new submodel location.

Control and data flows between components of the RTI 625 begin with reading a command, indicated by block 639, and executing it at block 641. Execution causes either control of the model to execute up to the next event 642 or updating of trace setting data 643 or break, step and setting data 645 as previously described. The output resulting from the command execution is sent back to the GRI, indicated by block 647, for display in the GRI's RTI output window, indicated by block 633 or for use to update inspectors, as shown by block 649. An RTI prompt is then sent, indicated by block 651, to the GRI for display in the output window, block 633, or to update inspectors, block 649. The RTI is then ready to read the next command from the GRI.

As previously described in connection with FIG. 4, once the model executes up to the next step, indicated by block 642, the RTI checks it for a break or step, indicated by block 653, and for trace output and then sent to the GRI as represented by blocks 655, 657 and 661. While the trace messages are being sent, flow breaks are checked for by the RTI, as indicated by block 659, to preserve synchronization of the model to the animation. Trace messages are sent to the RTI output display window, to the update inspector function and a function for checking for animatable tracings, as represented by blocks 633, 649 and 663, respectively. Completion of a break point also causes a prompt to be sent by the RTI, as shown by block 651, to the prompt process 628 for displaying in the output window, as shown by block 633.

Animation settings 665 determine what trace is to be animated at block 663. If the trace is animatable, a model graph 667 is looked up and displayed, as represented by block 669. Then, based on the animatable trace messages, the necessary animation is looked-up and displayed, as indicated by block 671. Finally a user command 609 or use of a soft button 603 may signal the break monitor 659 to pause the simulation at the next event and enter the command loop as previously described for block 625.

Figure 7:
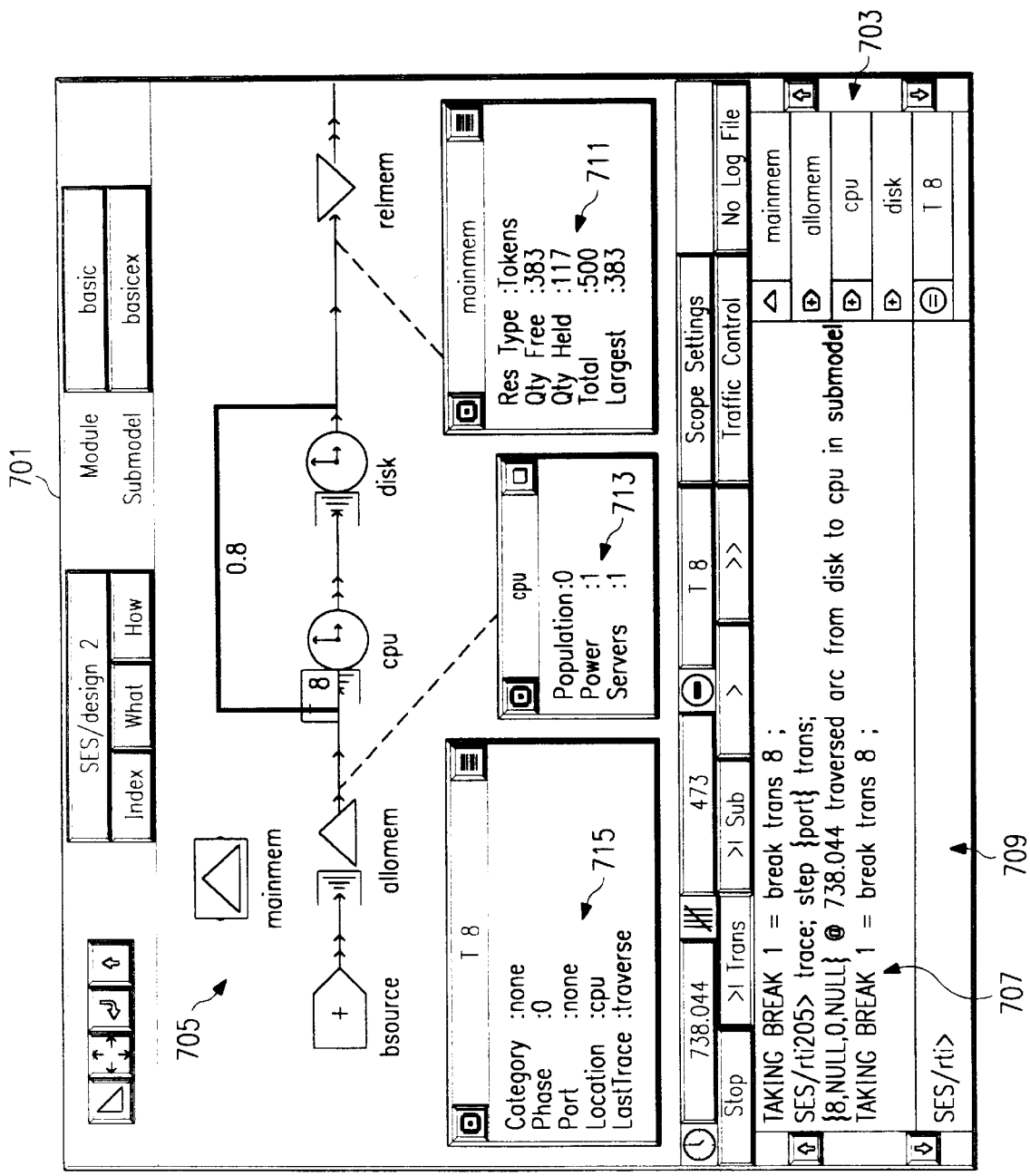
FIG. 7 is an illustration of a display window on a monitor of a data processing system for the graphical runtime interface of FIG. 3.

Referring to FIG. 7, shown is an illustration of a user display screen created by the GRI on a monitor attached to a computer running the simulation model and the GRI. It is basically divided into two components: an animation window 701, and a text window 703. The animation window 701 provides a means of graphical communication of the current state and state transitions of an executing simulating system. The main purposes of the text window 703 are to provide a history of recent activity and to provide for user keyboard input. Users can, at any time, scroll back into this history to determine the sequence of events which resulted in the current model state.

The event history is kept in subwindow 707 of window 703. The purpose of subwindow 707 is to record the most recent user commands and model execution. This information is dynamically updated as the model runs and as the user enters commands. The types of information displayed in this window are: textual representations of the trace events, manually entered commands, other user input (commands from pressing buttons, selecting menus, etc.), prompts, command line numbers, miscellaneous information generated by the RTI.

A second subwindow 709 is a strip along the bottom of the window 703. It serves as the input locale for manually typed commands. Characters are buffered here until the user enters a "return," at which time the command is sent to the RTI. This window also provides a command history mechanism that allows users to recall recent commands for subsequent modification and execution. This command history is accessed via the keyboard. Users can tell if the model is waiting for the next command by looking in this window for the prompt; if it is not present the model is running.

Animation window 701 displays selected animation to reveal the states and transitions of the running model. Shown in animation window 701 of FIG. 7 is an example of a hierarchal-directed process execution graph 705 that is dynamically animating a running simulation model. Generally, these animations provide powerful, effective means of quickly communicating the current state and state transitions in an executing model. These animations take many forms which are loosely classified as transaction animation, arc traversal animation, and node animation. This corresponds to the main components of hierarchical-directed graphs—namely, transactions, arcs, and nodes. The animations are driven from events (trace, prompt, and print) from the running model.

Figure 8A:
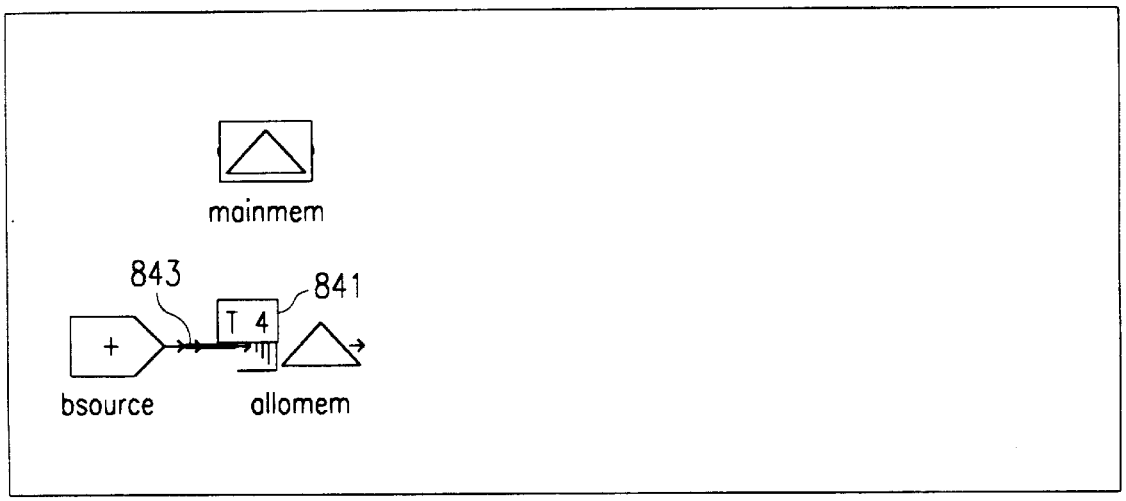
FIGS. 8A, 8B and 8C are illustrations for cell animations for various transactions, arcs and nodes used by the graphical runtime interface to animate an executing simulation model.
Figure 8A:
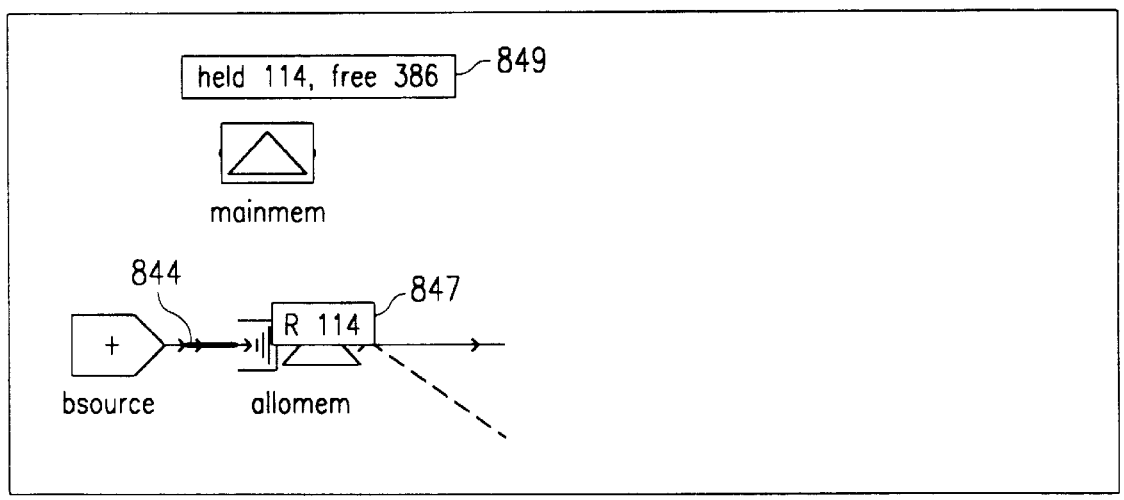
Figure 8A:
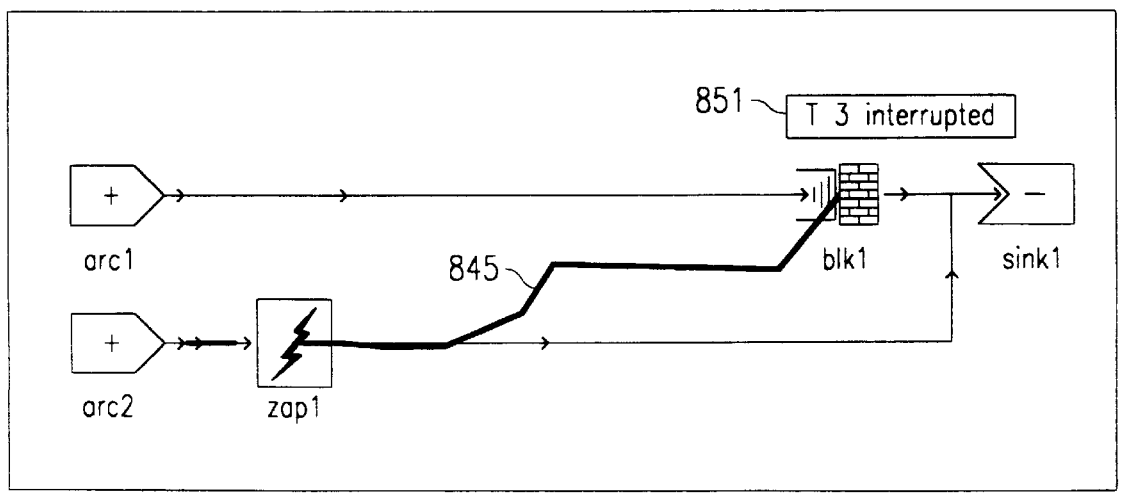

Referring to FIG. 8A, three examples of transaction, arc and node animation are shown. Transaction animation conveys the current transaction number and its relative location within the model. The specific animation 841 is implemented by displaying a framed "box" containing a letter "T" and the transaction number which is the unique identifier for the transaction. This box is moved along particular arcs as the transaction moves from node to node.

Arc traversal animation conveys the recent history of locale for the current transaction. The specific animation is implemented by changing the normal appearance of an arc to appearing as a "bold" arc such as shown at 843 and 844, much thicker than its normal state. As the transaction moves through the graph, it leaves a "trail" of bold arcs. This trail remains as long as the given transaction remains current.

Node animations cover the broadest category of animations. These are implemented in several forms, including blinking nodes (using color or reverse video attributes), node animations via cell animations (rapidly iterating over a set of node images), creating a graphic lightning bolt from one node to another, shown at 845, creating a moving box containing textual resource information from one point to another 847 (for animation of resources), and display text information in a boxed string 849.

The information conveyed by these animations are locale for the model event, any secondary locale for the event (lightning and resource animations), and specific changes in the state of the model, such as changes in the state of a node queue. The tables below show some of the relationships between specific animations and the model trace events which trigger them.

| Animation Kinds | | | |
| --- | --- | --- | --- |
| 1. Node blinking | | 5. Transaction box | |
| 2. Cell animation | | 6. Triangle tail | |
| 3. Arc traversal | | 7. Boxed string | |
| 4. Lightning bolt | | | |

| Trace Kind | Meaning | Associated Animations |
| --- | --- | --- |
| create | transaction creation and destruction | 2 |
| delay | transaction switching out | 2 |
| discipline | changes in the state of a queue | |
| fork | changes in fork/join status | 2,7 |
| interrupt | transaction interrupts | 1,2,4,7 |
| node | node entry and exit | 2 |
| node enter | node entry | |
| node return | node exit | 2,7 |
| port | traversal of an arc | 3 |
| resource | manipulation of a resource | 6,7 |
| set | effect of a set (power) statement | 7 |
| source | enable trace for monitor transactions | 2 |
| submodel | submodel entry and exit | 1 |
| submodel enter | submodel entry | 1 |
| submodel return | submodel exit | 1 |
| switch | transaction posting and activation | 2 |

Among the kinds of events that can be animated are the following:

As a transaction flows through a model traversing arcs, it is represented by a rectangle containing a "T" (for transaction) followed by the transaction identification number 841. This permits observation of the paths that specific transactions follow as they traverse a graph. As transactions traverse the arcs in a graph and enter nodes, the most recently traversed arc is thickened considerably 843 and 844, so that the path that a transaction takes from one node to the next can be easily followed.

Figure 8B:
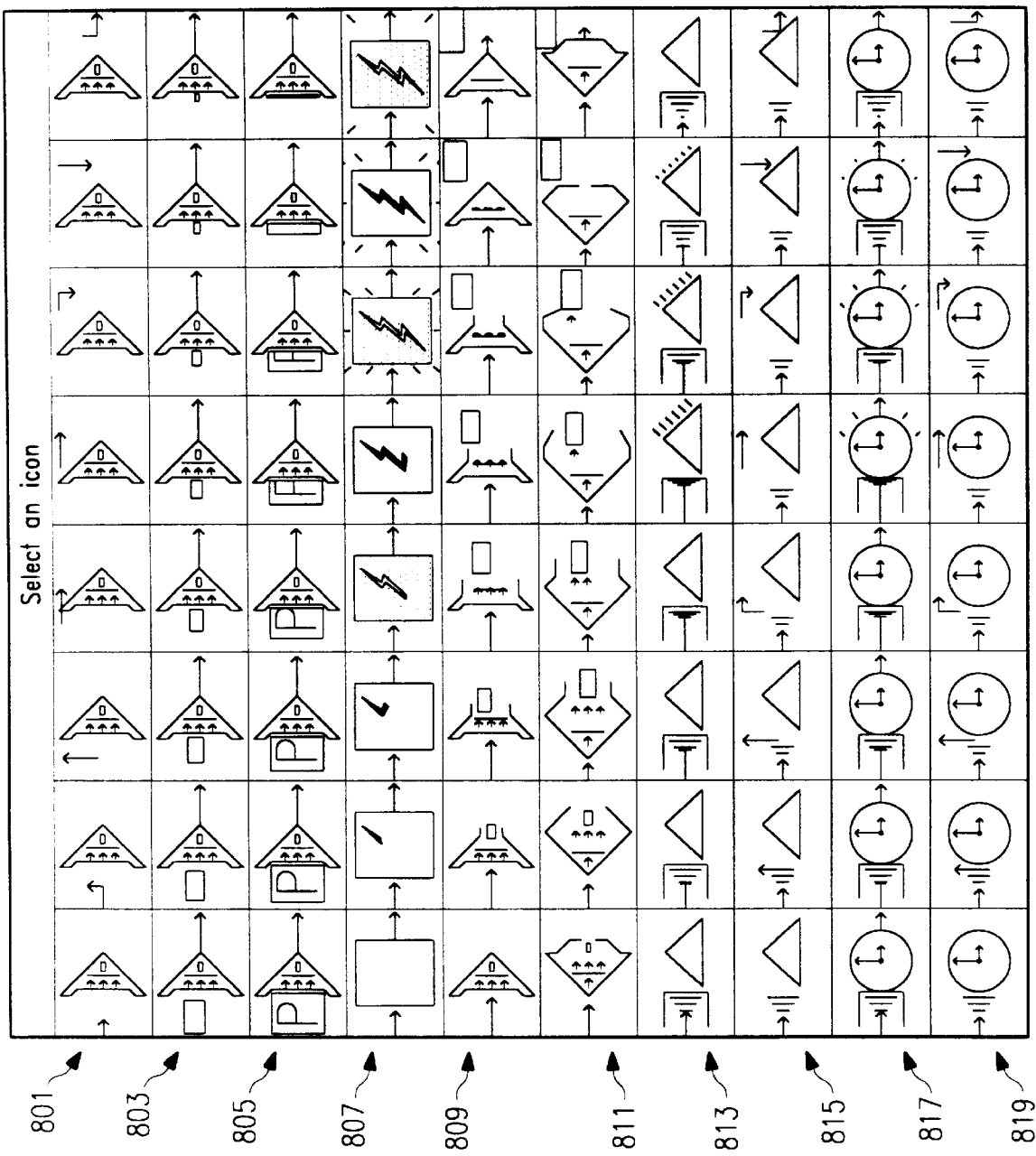
Figure 8C:
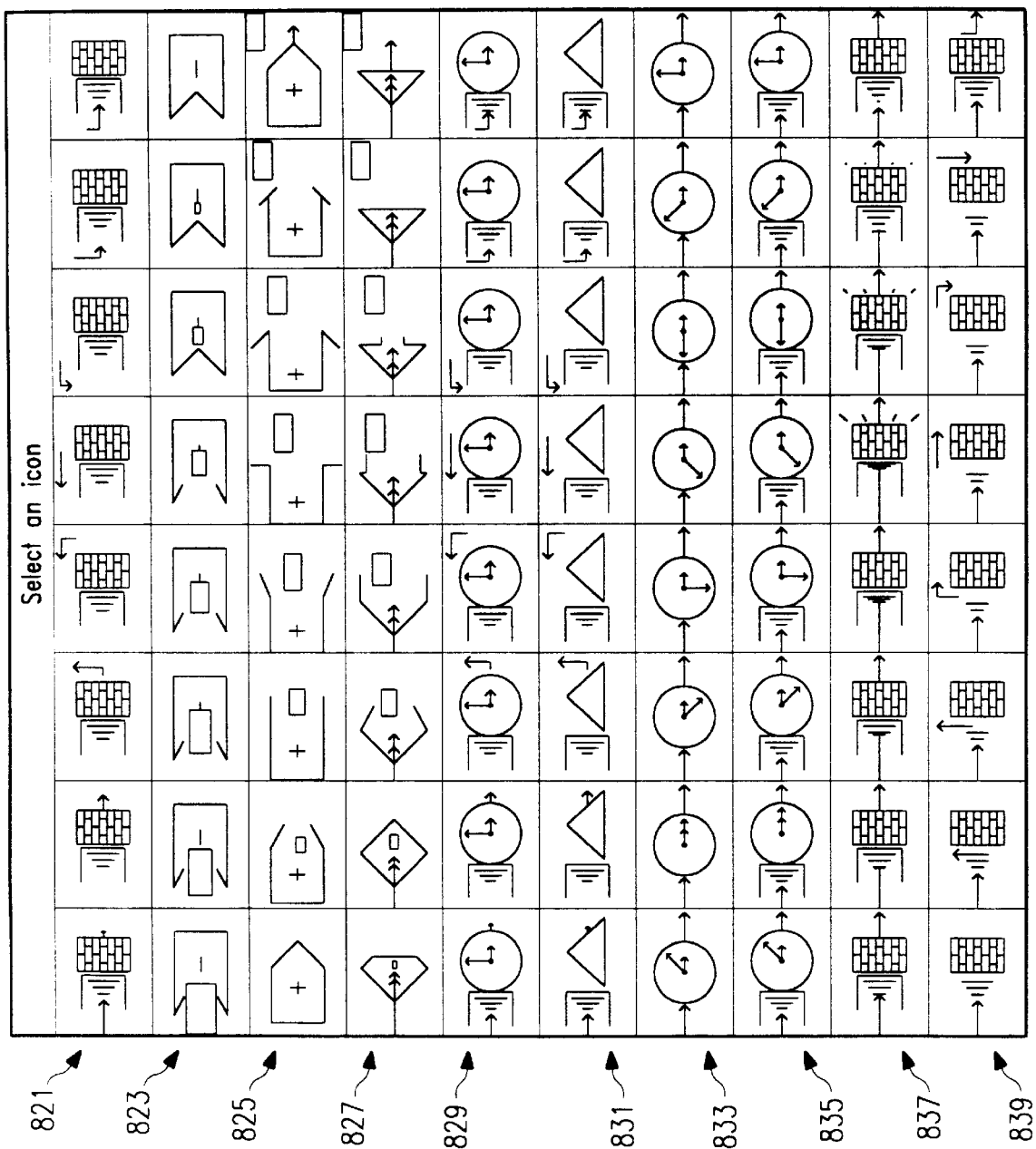

When a transaction is injected into a model at a source node, the user's eye is directed to the node by a series of squares that shrink rapidly around the node, providing a zooming effect that draws attention to the node of interest. This zooming effect is used at many points by the animation system to focus the user's eye on the portion of a graph in which the next animation will occur. It does not signify any particular event taking place in the model. FIGS. 8B and 8C show on each row a cell animation for a particular node. When one of these nodes is to be animated, these images are sequentially displayed to create a dynamic animation. For example, the source node appears to open when a transaction leaves it, as shown on row 825 in FIG. 8C. Similarly, when a transaction arrives at a sink node the rectangle representing the transaction shrinks and disappears into the node, as shown at row 823.

Split and fork nodes appear to open as transactions leave them, displayed in rows 827 and 811, respectively. When a parent transaction arrives at a join node it is momentarily represented as a large P that enters the node, shown on row 805. The join node appears to open as a parent transaction leaves a join node 809, after all of its child transactions have joined. If a parent transaction arrives at a join node after all of its children have joined, a small arrow travels clockwise around the join node 801. Rectangles representing child transactions shrink and disappear as they enter join nodes, displayed on row 803. When a transaction receives service at a Service node (see row 835) or is delayed at a Delay node (see row 833), the node's clock hands make one revolution to indicate activity.

Transactions arriving at queuing nodes (service, allocate and block nodes) simply enter the node if no other transactions are waiting in the queue. When a transaction arrives at a queue in which other transactions are waiting, the arrow pointing into the queue stretches toward the queue and the transaction enters the queue, as shown in rows 813, 817 and 837. When a transaction leaves a queuing node, a small arrow travels around the node in a clockwise direction to indicate that its departure is imminent, see rows 815, 819 and 839.

When a transaction arrives at an Interrupt node and an interrupt is generated, the Interrupt node flashes, shown on row 807. If the interrupted transaction is within a node in the same submodel, a line resembling a lightning bolt is drawn from the interrupt node to the node at which the transaction is being interrupted 845. A message then appears in a small rectangle above the node identifying the interrupted transaction 851. Similarly, when a transaction arrives at a set node and resets the power of an allocate, block or service node, a small rectangle travels from the set node to the node being reset. A message then appears in a rectangle above that node identifying the power to which the node has been reset. When a transaction is preempted by a higher priority transaction while it is executing a block, allocate or service function, a small arrow travels around the node in counter-clockwise direction to indicate that it is returning to the queue, see rows 821, 831 and 829.

When a transaction arrives at an Allocate node, a small rectangle identifying the number of resource elements moves from the Resource node representing the pool from which the resource is being allocated to the allocate node 847. A message then appears in a rectangle above the resource node identifying the number of pool elements held by transactions and the number that are free 849.

When resource elements are released by a transaction, for example at a Release or Sink node, the elements are represented as a rectangle that moves from the node at which they are released to the Resource node to which they are returned. When resource elements are consumed or destroyed an "X" is added to the text of the animation to signify the consumption or destruction of the number of resource elements. As transactions move from submodel to submodel the submodel exit and entry nodes blink several times to indicate that a transaction is leaving or entering the submodel at that node.

Figure 9:
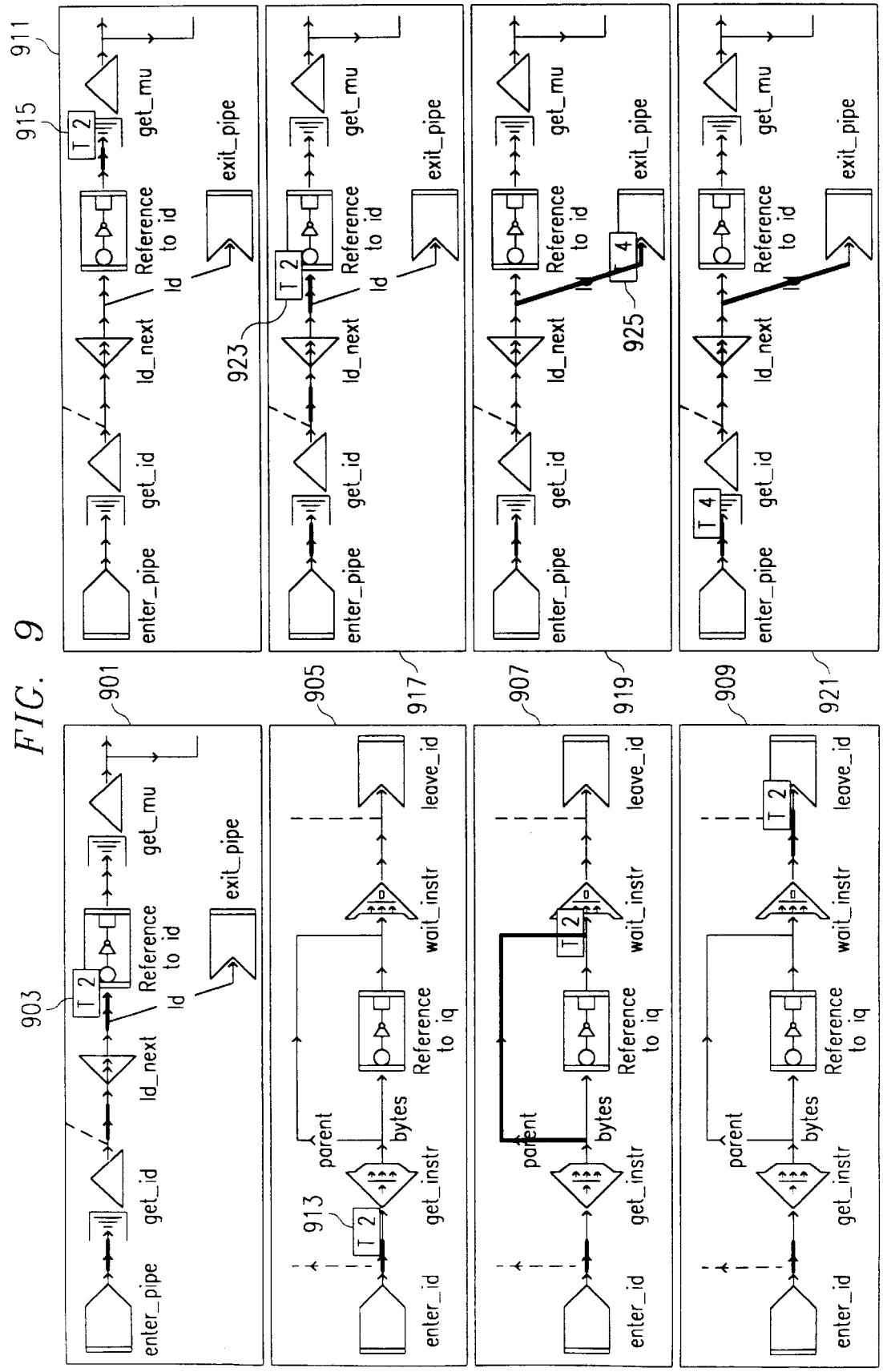
FIG. 9 is an illustration of two example sequences of animation displays which result from stepping the animation using transaction and submodel animation constraints.

FIG. 9 is an illustration of the differing animation sequences which result from using the transaction and submodel animation constraints. Animation display 901 depicts a situation wherein transaction two (T2) is about to enter a subgraph called "id" 903. The animation displays 905, 907, 909 and 911 depict the next few animation displays which would appear if the current transaction animation constraint was used while stepping the model execution. The animations follow the execution of transaction two into the id subgraph 913 and through the id subgraph 905, 907 and 909 until it returns to the original calling graph 915. The animation displays 917, 919 and 921 depict the same starting situation as in 901. However, the next two animation displays result from stepping the model while using the current submodel animation constraint. The animation display first depicts the execution of transaction two 923 in 917, and then switches to the animation of transaction four 925 when continued animation of transaction two would require the display of a different subgraph.

What is claimed is:

1. A method of animating a system having parallel processes for the purpose of debugging the system, the system being modeled as a hierarchical collection of directed process execution graphs, said graphs representing sub-models of the system and having collections of nodes and arcs, and the parallel processes as transactions, the nodes indicating manipulation of physical or logic resources or other process steps in a transaction's life, and the arcs indicating paths along which transactions may flow from one node to another; the method comprising the steps of:

(a) executing a computer process having parallel execution threads representing parallel processes in a system;

(b) selecting one of the execution threads for animation of preselected events during the execution thread, the execution thread being represented by a transaction in a model of the system, the model including one or more hierarchial directed process execution graphs representing one or more sub-models of the system;

(c) animating the selected execution thread on a user's display screen by displaying a graph in which the transaction is located, moving a symbol on the displayed graph representing the single transaction along arcs connecting nodes to which the transaction flows, and terminating animation of the selected execution thread when the transaction is blocked by the occurrence of a predefined event;

(d) displaying user-defined inspection data on said user's display screen, wherein said inspection data comprises user-selected program operating parameters from user-selected nodes; and (e) selecting a next transaction representing another of the parallel execution threads for animation and animating the next transaction until it blocks.

2. The method of claim 1 wherein the step of animating further includes the step of switching to a display of another graph if the transaction flows to the other graph.

3. The method of claim 1 the step of animating is further comprised of the step of limiting display of a transaction to selected model contexts.

4. The method of claim 1 wherein the step of animating is further comprised of the step of generating trace messages upon occurrences of preselected events related to an executing thread, the trace messages determining the graph in which the transaction representing the execution thread is displayed and movement of the transaction.

5. A discrete event simulator having a graphical debugging interface, the simulator having multiple execution threads in which only one thread is executed at a time, through one or more events, until an occurrence of a blocking event; the simulator being used to model systems having parallel processes, wherein the processes are modeled by transactions, with each transaction corresponding to one executing thread in the simulator, and the system is modeled with one or more hierarchical directed process execution graphs with nodes representing manipulation of resources or process step during a transaction's life and arcs representing paths transactions take between nodes; the simulator comprising:

(a) means for carrying out a discrete event simulation process having multiple parallel transactions by execution of one transaction at a time until the transaction is blocked by an occurrence of a blocking event, the means for carrying out the discrete event simulation process including means for generating a stream of trace messages, the trace messages describing occurrences of preselected events during execution of a first transaction and a switching of the discrete event simulation process to a next transaction upon occurrence of a blocking event to the first transaction, wherein the means for carrying out a discrete event simulation includes means for controlling an execution of and changing a state of and displaying the state of the simulation process in response to commands received from a graphical user interface means; and (b) said graphical user interface means which is responsive to a flow of trace messages having:

(1) a user viewing screen;

(2) means for selecting one hierarchical directed process execution graph based on a trace message and causing to be displayed on the viewing screen a directed process execution graph in which events associated with an executing transaction take place;

(3) means for sequentially animating with a symbol movement of an executing first transaction between nodes of the displayed graph in response to the trace messages; and (4) means for receiving commands from a user input and providing the commands to the means for carrying out a discrete event simulation, wherein the means for carrying out a discrete event simulation includes means for controlling the execution of and changing the state of and displaying the state of the simulation process in response to commands received from the graphical user interface.

6. The simulator of claim 5 wherein the graphical user interface partitions a user view screen into a first and a second window; the means for selecting and displaying the graph causing the selected graph to be displayed in the first window; and the graphical user interface causing text of the trace messages to be displayed in the second window.

7. The simulator of claim 5 wherein the graphical user interface includes means for distinguishing a variety of predefined simulation event types and means for displaying a distinct specialized animation for each such event type.

* * * * *